United States Patent [19]
Marsh

[11] 3,986,874
[45] Oct. 19, 1976

[54] DRIOGRAPHIC IMAGING METHOD

[75] Inventor: Dana G. Marsh, Rochester, N.Y.

[73] Assignee: Xerox Corporation, Stamford, Conn.

[22] Filed: Oct. 23, 1974

[21] Appl. No.: 517,121

[52] U.S. Cl. .................................. 96/27 R; 96/28; 96/36.3; 101/471
[51] Int. Cl.² .................... G03C 5/04; G03C 11/12
[58] Field of Search ................. 96/115 R, 35.1, 33, 96/36.3, 27 R, 28; 204/159.21; 101/467, 471; 250/316, 318, 319

[56] References Cited
UNITED STATES PATENTS

| | | | |
|---|---|---|---|
| 3,408,216 | 10/1968 | Mott et al. ............................. 117/.5 |
| 3,414,724 | 12/1968 | Kvarnegard ........................... 250/65 |
| 3,554,836 | 1/1971 | Steindorf ............................ 101/426 |
| 3,615,469 | 10/1971 | Ramp ................................... 96/36.3 |
| 3,644,118 | 2/1972 | Agnihoiri ......................... 96/115 R |
| 3,650,754 | 3/1972 | Jones ................................ 96/115 R |
| 3,752,076 | 8/1973 | Kaminstein ........................ 101/467 |
| 3,782,939 | 1/1974 | Bonham et al. ......................... 96/28 |
| 3,785,825 | 1/1974 | Deutsch et al. ......................... 96/33 |
| 3,822,126 | 7/1974 | Inoue et al. ......................... 96/27 R |

Primary Examiner—Edward C. Kimlin
Attorney, Agent, or Firm—James J. Ralabate; James P. O'Sullivan; Jerome L. Jeffers

[57] ABSTRACT

The present invention is a driograhic imaging method which employs an ink comprised of an organic material which is convertible from a state of high viscosity to a state of low viscosity by exposure to high energy radiation. The ink is applied to an inking roller in its initial state of high viscosity and exposed to activating radiation in an imagewise manner to convert the material to a state of low viscosity and thereby reduce the viscosity of the ink in a configuration corresponding to the pattern of radiation. Contacting the irradiated inking roller with a receiving member results in transfer of the ink in imagewise configuration from the inking roller to the receiving member.

12 Claims, 2 Drawing Figures

DRIOGRAPHIC IMAGING METHOD

BACKGROUND OF THE INVENTION

Lithographic printing methods using plates whose surface contains light reacted materials are known. One type of printing falling under this general classification involves the use of a photohardenable material which is soluble in certain solvents in the uncured state and insoluble in the solvent in the hardened state. The material is uniformly applied to a printing plate in the form of a thin layer. Exposing the layer to activating radiation causes it to harden in the exposed areas so that the non-exposed areas can be dissolved away thereby forming an etch resist. Exemplary of patents disclosing such a method is U.S. Pat. No. 1,574,378 in which gelatin is the layer forming material and the solvent is water.

U.S. Pat. No. 3,010,390 discloses a method of preparing a printing master which involves:

a. providing a hydrophilic printing surface uniformly covered with a layer of a hydrophobic material over which is placed a second surface which has a greater affinity for the hydrophobic material in its unsensitized state than does the printing surface;

b. selectively exposing the hydrophobic material to radiation to render it hydrophilic and thereby cause it to have a greater affinity for the printing surface than the second surface in the exposed areas; and c. separating the printing surface from the exposed hydrophilic material whereby those portions of the material which have been exposed "stick" to the printing surface to provide a printing master having the material on its surface in imagewise configuration.

It would be desirable, and it is an object of the present invention to provide a novel driographic imaging method which employs an ink whose viscosity is reduced by exposure to high energy electromagnetic radiation.

A further object is to provide such a process in which the ink comprises a photodegradable polymer.

An additional object is to provide such a process which is adaptable to a cyclic printing operation.

SUMMARY OF THE INVENTION

The present invention is a driographic imaging method which comprises:

a. providing an inking roller in the form of a supporting substrate whose periphery is at least partially arcuate having uniformly distributed on its surface a film of an ink comprised of an organic photoactive material in a state of high viscosity, said material being selected from those compositions which are convertible to a state of low viscosity by exposure to high energy activating electromagnetic radiation;

b. rotating the inking roller at a velocity at which the adhesion of the ink to the inking roller and cohesive forces between the ink particles are greater than the adhesion between the ink and a receiving member in contact with the inking roller at an arcuate area on its periphery; and c. exposing the ink film to activating electromagnetic radiation in imagewise fashion to reduce the viscosity of the ink in the exposed areas thereby reducing the adhesion of the ink to the inking roller and the cohesive forces between the ink particles and causing it to transfer to the receiving member in imagewise configuration corresponding to the pattern of the activating radiation upon contacting an arcuate portion of the inking roller with the receiving member and providing relative motion therebetween.

DETAILED DESCRIPTION

Figure 1:
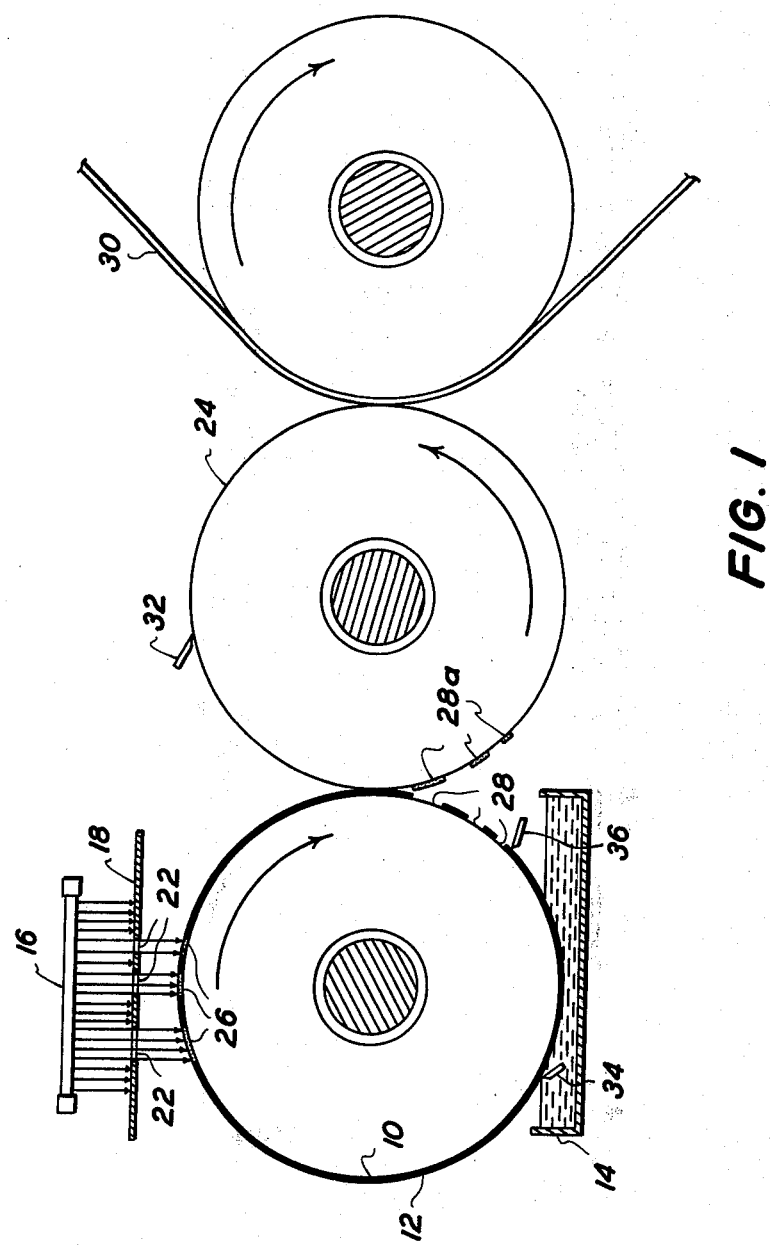
FIG. 1 is a schematic drawing of a printing apparatus comprising an inking roller coated with ink in operative relationship with an offset roller, an impression roller, and a selective radiation source.

One method of practicing the invention is illustrated by the drawings. In FIG. 1, inking roller 10 is uniformly coated with a layer of ink 12 by rotating it so as to pass its periphery through the ink supply vessel 14. As the inking roller rotates 180° from the ink supply, the inked portion passes under the radiation source 16. Activating radiation from the radiation source is directed through a stencil 18 having areas which are both opaque and transparent to the radiation. The transparent areas are designated as 22. Areas in the ink layer which are not exposed to radiation have sufficient cohesive forces, both internal and between the drum and the ink, so as to be unaffected when the inking roller contacts an offset roller 24. However, those areas of the ink layer which are irradiated, designated as 26, undergo a reduction in viscosity and consequently a reduction in cohesive forces so as to be transferred to the offset roller upon contact therewith. Thus, the depressions in the ink layer 28 represent areas that were irradiated and brought into contact with the offset roller. The ink formerly contained in these depressions adheres to the offset roller in imagewise configuration designated as 28a.

Figure 2:
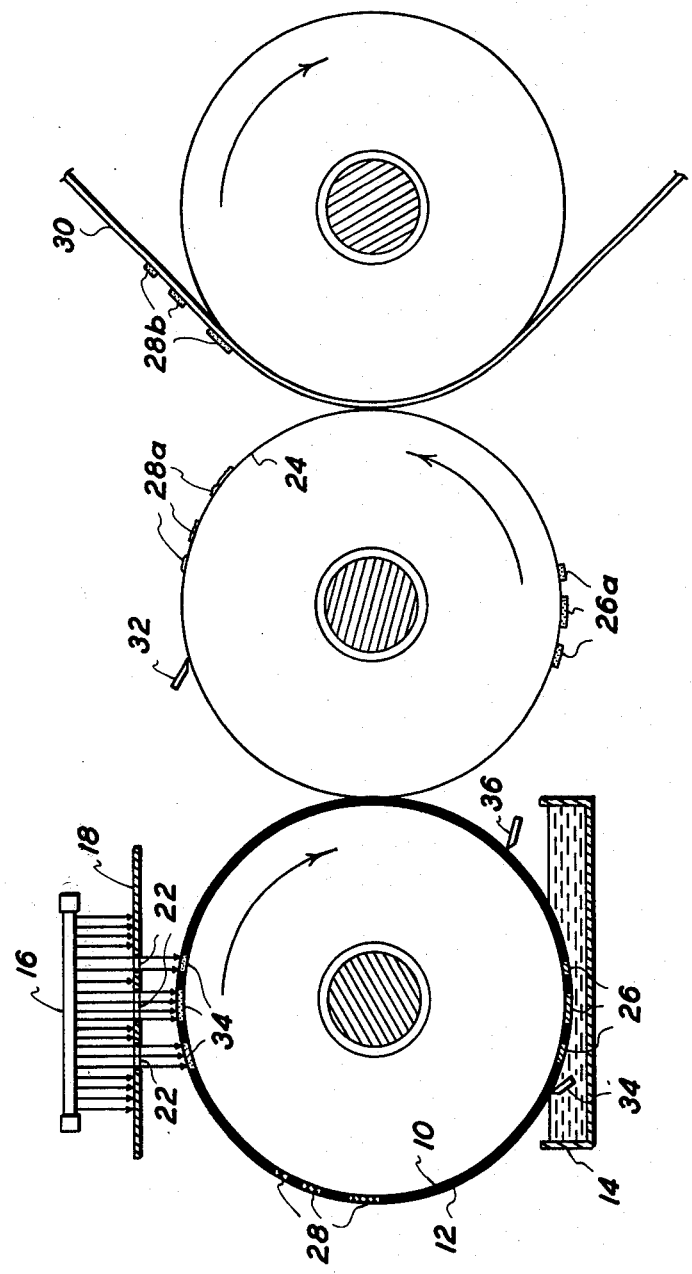
FIG. 2 is a schematic drawing of the printing apparatus in which the rollers have rotated 180° from the position they occupied in FIG. 1 to cause the transfer of ink from the offset roller to a receiving member.

FIG. 2 represents the printing apparatus after the rollers have rotated 180° from the positions they occupied in FIG. 1. As the drums rotate, a portion of the ink on the offset roller is transferred to the receiving member 30 in imagewise configuration. The transferred ink is designated as 28b. Normally, the ink of the offset roller is not completely transferred to the receiving member and a portion of this ink 28a remains on the offset roller. This remaining ink is removed from the offset roller by doctor blade 32. The embodiment depicted in the drawings represents a method of practicing the invention in which the drum is large enough to receive more than one image per revolution. Thus, the second image designated in FIG. 1 as 26 is transferred to the offset roller and designated as 26a. This image will be transferred to the receiving member upon further rotation of the rollers. A third image 34 is simultaneously formed in the ink layer by irradiation from irradiation source 16. The ink in areas 34, which has undergone a reduction in viscosity due to the irradiation, will transfer to the offset roller and subsequently to the receiving member upon further rotation of the rollers. The depressions left by removal of the ink from areas 28 have been filled by passing them through the inking vessel wherein ink is applied to the roller and smoothed to a uniform layer by doctor blade 34. This portion of the drum is now ready for reimaging. The depressions 26 from which ink has been transferred to the offset roller are filled with ink from the ink storage vessel and the ink layer will likewise be smoothed out as it rotates past the doctor blade 34. In some instances, not all of the ink in the irradiated areas will transfer to the offset roller and that which remains may mix with the ink in the ink supply vessel. This may be problematical for long printing runs since as the concentration of less viscous ink increases in the ink supply vessel, it can reduce the overall viscosity of the ink to an unacceptable level. Therefore, a third doctor blade 36 may optionally be applied to the inking roller to remove the ink film before the imaged portion of the roller reaches the ink supply vessel. The system illustrated by the drawings represents only one method of practicing the invention. Alternatively, the irradiation source can be set up to scan the image to be transferred to the ink layer. In addition, multiple synchronous exposures through the negative may be used. It is not necessary to provide more than one image per drum revolution since longer documents may require the entire drum surface. While an offset roller is preferably employed, it is by no means critical to the practice of the invention; the ink can be transferred directly from the inking roller 10 to the receiving member 30. While cyclical operation would normally be preferred, operation in the single pass mode, optionally using a pre-inked roller, can be employed where desired.

In the embodiment depicted by the drawings, the printing roller is illustrated as cylindrical in configuration. Alternatively, an endless belt, supported for example by a tri-roller setup, could be employed since the only critical requirement in inking roller configuration is that its periphery be arcuate at the region of its contact with the receiving member to facilitate ink transfer. The endless belt/tri-roller configuration would provide a flat surface during exposure and could be preferred in some instances to avoid distortion of the image.

The ink in ink supply vessel 14 will necessarily have a fairly high viscosity in order that it have sufficient cohesive forces to prevent its transfer to the receiving member in the absence of being exposed to activating radiation. The requisite viscosity will vary depending on factors such as materials of construction for the inking roller and receiving member, roller velocity for a particular operation, etc. A person skilled in the art who seeks to produce an ink useful in a given system will realize that he must conduct a few trials to arrive at the optimum viscosity for a given situation.

The key to the process of the present invention depends upon the fact that a solution (in this case ink) forced to split between two rollers will split at the region of lowest viscosity. Thus, any photochemical reaction that may cause a reduction of viscosity in image areas may be utilized in the process. An example of such a reaction is a cis-trans isomerization. Thus, if a macromolecule in solution is forced by light into a changed conformation or dimension, a change in viscosity would be expected. For example, a macromolecule normally in a coiled configuration may be made to extend by binding to it charged azo dye moieties in the trans form. Upon irradiation, a change of the dye to the cis form occurs via cis-trans isomerization. The less tightly bound charged cis azo dyes can leave the macromolecular domain taking their charges with them and allowing the polymer to relax to the coiled configuration. This results in a decrease in viscosity. Such a photoisomerizable composition can be prepared by reacting poly(vinylpyrolidone) or poly(methacrylic acid) with an azo dye such as that designated as D160III, in the Color Index, which is chemically the tetrapotassium salt of 4,4'-bis(4-methoxycarboxyphenyl-azo)-stilbene 2,2'-disulfonic acid. An alternative involves the incorporation of photoisomerizable groups along a polymer backbone. Isomerization of these groups results in a decrease in viscosity. The photoregulation of polymer configuration by photochromic moieties is more fully described by van der Veen, et al in *Photochemistry and Photobiology* (1974) vol. 19, Pp. 191–196 and Pp. 197–204.

In another embodiment, the ink comprises a photodegradable polymer which degrades to a state of lower viscosity when exposed to activating radiation in the presence of a photoactive agent. A preferred class of photodegradable materials are those polymeric compositions containing segments characterized by the structural formula:

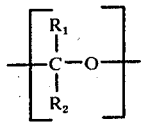

wherein $R_1$ is hydrogen or methyl and $R_2$ is hydrogen, an alkyl radical of 1 to 6 carbon atoms, a chlorinated or fluorinated aliphatic radical of 1 to 6 carbon atoms or a cyano substituted radical of 1 to 5 carbon atoms provided that when $R_1$ is methyl, $R_2$ is also methyl.

Suitable degradable polymers for use in the process of the instant invention can be prepared by the polymerization of aldehydes to give polymers which correspond to the formula previously set out. When aldehydes which contain alkyl groups of 1 to 6 carbon atoms attached to the carbonyl carbon atom are polymerized, polymers result in which the $R_2$ moiety corresponds to the alkyl group of the aldehyde. Examples of aldehydes which contain such moieties include acetaldehyde, propionaldehyde, n-butyraldhyde, isobutyraldehyde, valeraldehyde and heptaldehyde. The $R_2$ moiety may also be hydrogen as is the case with poly (formaldehyde).

Alternatively, the aldehyde may contain a chlorinated or fluorinated hydrocarbon radical of from 1 to 6 carbon atoms to provide a polyaldehyde in which the R moiety corresponds to the group attached to the carbonly carbon of the aldehyde. Examples of such aldehydes include chloroacetaldehyde, dichloroacetaldehyde, chloropropionaldehyde, chlorobutyraldehyde, chlorovaleraldehyde, chloroheptaldehyde, trifluoroacetaldehyde, trifluoropropionaldehyde, chlorodifluoroacetaldehyde and fluoroheptaldehyde.

In addition, aldehydes which contain cyano substituted aliphatic hydrocarbon radicals containing from 1 to 5 carbon atoms attached to the carbonyl carbon can be polymerized to form degradable polymers useful in the process of the instant invention. Examples of these aldehydes include cyanoacetaldehyde, betacyanopropionaldehyde and 5-cyanopentaldehyde.

While ketones are not normally thought of as being polymerizable, poly(acetone) has been reported in the literature by V. A. Kargin, et al in Dokl. Akad. Navk. SSSR, 134, 1098 (1960), and can be degraded by the action of photo-oxidants in a manner similar to polyaldehydes. Thus, polymers corresonding to the foregoing formula in which both $R_1$ and $R_2$ are methyl may be used when the photoactive agent is a photo-oxidant.

When homopolymers of the above-described carbonyl compounds are used, the degradable polymer can be represented by the formula:

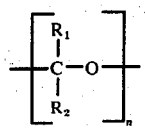

where $R_1$ and $R_2$ are as defined above and $n$ is a number representing the degree of polymerization. The degree of polymerization of the homopolymer may be quite low as in the case of oligomers or as high as the realities of the polymerization of the carbonyl compound permit. In general, those polymerized carbonyl compounds characterized by the foregoing formula in which $n$ is a number in the range of from 20 to 20,000 are preferred for use in the instant invention.

In addition to homopolymers of the aforementioned carbonyl compounds, copolymers and block copolymers containing degradable segments characterized by the foregoing formula can be employed. For example, copolymers and block copolymers may be prepared from one or more of the carbonyl compounds and other polymerizable constituents such as styrene, isoprene, α-methylstyrene, methylmethacrylate, phenyl isocyanate and ethyl isocyanate. In addition, the degradable segments may occur as side chains appended from the backbone of another polymer.

Typically, photoactive agents are selected from the group of hydrogen abstracting agents and photo-oxidants. Useful hydrogen abstracting photoactive agents include those compounds which, upon activation, are capable of abstracting a hydrogen atom from the backbone of the degradable polymers. While the process of the instant invention is not predicated upon any particular theory of operation, it is believed that upon irradiation this type of photoactive agent may abstract a hydrogen atom from the polyaldehyde backbone thereby forming a free radical species on a carbon atom. At this point, chain cleavage occurs as the result of the rearrangement of electrons in a carbon-oxygen sigma bond and polymer degradation occurs whereby the molecular weight of the polymer is greatly reduced.

A preferred class of photoactive agents is made up of those compositions which, when subjected to activating radiation, assume a $^3(n,\pi^*)$ or $^1(n,\pi^*)$ state. Many compositions are available which are capable of assuming such a state and are thereby able to abstract a hydrogen atom from the polymer backbone. In general, five classes of compounds are capable of assuming such an excited state and abstracting a hydrogen atom. These classes are:

1. Carbonyl compounds with reactive $^3(n,\pi^*)$ states such as for example, benzophenone, 2-tert-butylbenzophenone, 4-aminobenzophenone, and 4-phenylbenzophenone; substituted acetophenones, e.g. 4-methoxyacetophenone, and aldehydes, e.g. benzaldehyde and anisaldehyde.

2. Thiocarbonyl compounds such as for example, thiobenzophenone, 4,4'-dimethoxythiobenzophenone, substituted thiobenzophenones, thioacetophenone and substituted thioacetophenones.

3. Aromatic nitro compounds having reactive $^3(n,\pi^*)$ states such as nitrobenzene and 1,2-dinitro-3,4,5,6-tetramethylbenzene.

4. Arylimines and alkylimines having reactive $^3(n,\pi^*)$ states such as N-alkylbenzophenoneimine and benzophenone-N-hexylimine.

5. Aromatic amines having reactive $^1(n,\pi^*)$ states such as acridine and phenazine.

Another class of photoactive agents useful in the invention is that of organic peroxides such as for example, dibenzoylperoxide, tert-butylperoxide, 2,4-dichlorobenzoylperoxide and cumylperoxide. In general, those organic peroxides which form free radicals and thereby are able to abstract hydrogen atoms are useful.

An additional class of hydrogen abstracting compounds which can be used in the invention is made up of organic halides, for example, alkyl halides such as carbon tetrachloride, chloroform, carbon tetrabromide and bromoform.

Since these photoactive agents degrade the previously described polymer by abstracting a hydrogen atom from the polymer backbone, $R_1$ in the foregoing formula must be hydrogen when this type of photoactive agent is used.

Another type of photoactive agent which may be used is a photo-oxidant which upon activation is capable of abstracting one or more electrons from one or more oxygen atoms of the degradable polymer or by an alternative mechanism of oxidizing the degradable polymer. Suitable photo-oxidants include pyrylium salts, e.g. 2,4,6-triphenyl pyrylium tetrafluoroborate and 2,4,6-tritolylpyrylium tetrafluoroborate; anthracene and derivatives, e.g. 9,10-dicyanoanthracene; diazonium salts, e.g. diethylaminobenzene diazonium tetrafluoroborate; diethylaminobenzene diazonium zinc chloride; unsaturated anhydrides, e.g. maleic anhydride, chloromaleic anhydride and pyromelletic dianhydride; bipyridylium salts, e.g. 1,1'-dimethyl-4,4'-bipyridylium dichloride; tosylate salts, e.g. tetraethylammonium-p-toluene sulfonate and diaza heterocyclic compounds, e.g. pyridazine; 9,10-diazaphenanthrene; 1,2-diazanaphthalene; 5,10-diazaanthracene; 1,2:3,4:6,7-tribenzophenazine; 1,4-diazanaphthalene; and 5,6:7,8-dibenzoquinoxaline.

In addition certain dyes and colorants listed in the *Colour Index*, vol. 4 and 5 of The Society of Dyers and Colourists American Association of Chemists and Colorists may be used as the photo-oxidant. Exemplary of these materials are hydroxy phthaleins, e.g. Rose Bengal, Phloxine, Phloxine B, Erythrosin B, Erythrosin, Fluorescein, Eosine and Dibromoeosine; Acridines e.g. Acriflavin and Acridine Orange R; Thiazones, e.g. Methylene Blue; Rhodamines, e.g. Rhodamine B and Rhodamine 6G; Monoazo dyes, e.g. Methyl Orange and Triarylmethane dyes (diamino and triamino derivatives), e.g. Brilliant Green and Methyl Violet.

Also, natural organic sensitizers such as chlorophyll, riboflavin and hematoporphrins may be used as photo-oxidants in the present invention.

The wavelength of radiation necessary to cause the ink to undergo a reduction in viscosity will depend on the particular photoactive material employed as well as the particular photosensitizer where one is required. In general, electromagnetic radiation in the ultraviolet, near ultraviolet and blue-green region of the visible spectra will be employed. Infrared radiation is not of sufficiently high energy to be useful in the process of the instant invention.

The photoactive material may be combined with a coloring agent and a solvent to form inks useful in the process of the instant invention. Typical solvents are those organic liquids which will dissolve the material to form a solution of the desired viscosity. In addition, the solvent should be sufficiently volatile so as to readily evaporate from the solid portions of the ink upon image formation. Examples of solvents include kerosene, acetone, mixtures of liquid aromatic and aliphatic liquids, chlorinated hydrocarbons such as methylene chloride, trichloroethylene, perchloroethylene, and methyl chloroform as well as the commercially available organic ink vehicles. Routine experimentation may be required to match up the best solvent with the particular degradable material being employed. The use of a solvent is optional since, when desired, the photoconvertible material may be prepared having the desired viscosity. Likewise, a coloring agent need not be employed in every instance.

The nature of the coloring agent, i.e. pigment or dye, is not critical provided it provides the necessary opacity to the ink and consists of a material which is compatible with the photoconvertible material. Suitable coloring agents are those compositions which are compatible with the material and will increase its optical density so as to render it visible. Thus, carbon black or other minutely divided carbonaceous pigments may be employed. Other organic and inorganic pigments and dyes may be employed such as for example, titanium dioxide, zinc oxide, lithopone, magnesium silicate, China clays, complex aluminum silicates, barium sulfate, iron oxide red pigments, cadmium reds, copper phthalocyanine blue, thioindigo pigments, anthraquinone pigments, alkali blue, Congo Red, Diazon Blue, Benzo Fast Blue and Chrysophenine Y. The amount of coloring agent is not critical since the only requirement is that it provide the desired degree of opacity. Typical ink compositions will contain from 15 to 30 weight percent of the pigment or dye being employed. The presence of a coloring agent is not essential since the ink will be tacky upon transfer from the inking roller to the receiving member and may be dusted with a colored powder. In some instances, the photoconvertible material will be colored and in some situations it may not be desired to color the ink either before or after transfer to the receiving member. When a coloring agent is used in formulating the ink, care should be taken to select those compositions which will not adversely affect the absorption characteristics of the photoconvertible material.

The invention is further illustrated by the following example.

EXAMPLE I

A viscous ink is prepared by thoroughly mixing 0.5 gm. of poly(acetaldehyde) in 10 milliliters of benzene with 2 milliliters of $1 \times 10^{-2}$ M benzophenone in benzene as photosensitizer. The solution is spread onto an aluminum sheet using a single pass with a doctor blade set at 25 mil to provide a film of approximately 1 mil in thickness after evaporation of the solvent. The aluminum sheet bearing the ink is attached to the drum of a conventional printing press.

The ink film is exposed through a positive transparency to the radiation emitted from a PEK-110 high pressure mercury arc used unfiltered and at 100 watt output. The radiation source is positioned approximately 12 inches from the ink film with the transparency interposed between the radiation source and the ink film at a distance of 2 inches. A 600 second exposure is employed to reduce the viscosity of the ink in the areas corresponding to the transparent portions of the transparency. After exposure, an image corresponding to that of the transparency is observed but does not appear to be depressed into the surface of the film.

The printing press roller is rotated while contacting its surface with paper sheets in the conventional manner. Several passes are made which result in the ink offsetting onto the paper in imagewise configuration corresponding to the transparent areas of the transparency. The offset ink which is still tacky is dusted with carbon black which results in a visible image on the paper corresponding to the negative print of the positive original. After printing, examination of the master reveals that light struck areas are depressed below the areas corresponding to the opaque areas of the transparency. These observations indicate that the sensitized poly(acetaldehyde) is changed by photolysis such that the light struck areas selectively offset to the paper.

In an alternative embodiment, the carbon black is mixed with the ink thereby obviating the need for dusting the transferred ink to provide a visible image.

What is claimed is:
1. A driographic imaging method which comprises:
  a. providing an inking roller in the form of a supporting substrate whose periphery is at least partially arcuate having uniformly distributed on its surface a film of an ink comprised of an organic photoactive material in a state of high viscosity, said material being selected from those compositions which are convertible to a state of low viscosity by exposure to a high energy activating electromagnetic radiation;
  b. rotating the inking roller at a velocity at which the adhesion of the ink to the inking roller and cohesive forces between the ink particles are greater than the adhesion between the ink and a receiving member in contact with the inking roller at an arcuate area on its periphery; and
  c. exposing the ink film to activating electromagnetic radiation in imagewise fashion to reduce the viscosity of the ink in the exposed areas thereby reducing the adhesion of the ink to the inking roller and the cohesive forces between the ink particles and causing it to transfer to the receiving member in imagewise configuration corresponding to the pattern of activating radiation upon contacting an arcuate portion of the inking roller with the receiving member and providing relative motion therebetween.

2. The method of claim 1 wherein an offset roller is employed as the receiving member and the ink is transferred from the offset roller to a second receiving member.

3. The method of claim 1 wherein the portion of the drum exposed to activating radiation is passed through an inking vessel subsequent to transfer to the image to the receiving member.

4. The method of claim 1 wherein the inking roller is cylindrical in configuration.

5. The method of claim 1 wherein the receiving member is paper.

6. The method of claim 1 wherein the photoactive material is a macromolecule having bound to it charged azo type moieties in the trans form which upon irradiation convert to the cis form, thereby allowing the polymer to relax to the coiled configuration and undergo a decrease in viscosity.

7. The method of claim 1 wherein the photoactive material is a photodegradable polymer and the ink contains a photoactive agent capable of causing degradation of the polymer upon exposure to electromagnetic radiation of the proper wavelength.

8. The method of claim 7 wherein the photodegradable polymer is a polymeric composition containing segments characterized by the structural formula:

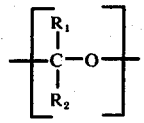

wherein $R_1$ is hydrogen or methyl and $R_2$ is hydrogen, an alkyl radical of 1 to 6 carbon atoms, a chlorinated or fluorinated aliphatic radical of 1 to 6 carbon atoms or a cyano substituted radical of 1 to 5 carbon atoms provided that when $R_1$ is methyl, $R_2$ is also methyl.

9. The method of claim 7 wherein the photoactive agent is a composition which upon activation is capable of abstracting an H atom from the polymer backbone thereby forming a free radical species on a carbon atom and $R_1$ in the foregoing formula is hydrogen.

10. The method of claim 7 wherein the photoactive agent is a photo-oxidant which upon activation is capable of abstracting one or more electrons from one or more oxygen atoms of the degradable polymer.

11. The method of claim 7 wherein the photoactive material is a homopolymer characterized by the formula:

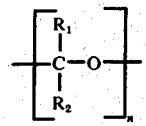

wherein $R_1$ and $R_2$ are as defined above and $n$ is a number representing the degree of polymerization.

12. The method of claim 1 wherein the photoactive material is combined with a coloring agent and a solvent.

* * * * *

UNITED STATES PATENT AND TRADEMARK OFFICE
CERTIFICATE OF CORRECTION

PATENT NO. : 3,986,874
DATED : October 19, 1976
INVENTOR(S) : Dana G. Marsh

It is certified that error appears in the above—identified patent and that said Letters Patent are hereby corrected as shown below:

In the Abstract, line 1, --driograhic-- should be corrected to read "driographic."

Column 4, line 66, --corresonding-- should be corrected to read "corresponding."

Signed and Sealed this

Twenty-eighth Day of December 1976

[SEAL]

Attest:

RUTH C. MASON
*Attesting Officer*

C. MARSHALL DANN
*Commissioner of Patents and Trademarks*